United States Patent
Kuczynski et al.

(10) Patent No.: US 7,298,623 B1
(45) Date of Patent: Nov. 20, 2007

(54) ORGANIC SUBSTRATE WITH INTEGRAL THERMAL DISSIPATION CHANNELS, AND METHOD FOR PRODUCING SAME

(75) Inventors: Joseph Kuczynski, Rochester, MN (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/427,382

(22) Filed: Jun. 29, 2006

(51) Int. Cl.
*H05K 7/20* (2006.01)
*H05K 1/00* (2006.01)

(52) U.S. Cl. .................. 361/719; 361/699; 361/720; 174/15.1; 174/16.1; 174/252

(58) Field of Classification Search ............... 361/699, 361/719, 689, 715, 718, 720; 174/252, 15.1, 174/16.1, 260; 257/713–714, 721
See application file for complete search history.

(56) References Cited

U.S. PATENT DOCUMENTS

| | | | | |
|---|---|---|---|---|
| 4,774,630 A | * | 9/1988 | Reisman et al. | 361/718 |
| 5,142,441 A | * | 8/1992 | Seibold et al. | 361/689 |
| 5,787,974 A | * | 8/1998 | Pennington | 165/164 |
| 5,929,518 A | * | 7/1999 | Schlaiss | 257/712 |
| 6,377,457 B1 | * | 4/2002 | Seshan et al. | 361/690 |
| 6,708,871 B2 | * | 3/2004 | Pierson | 228/246 |
| 7,139,172 B2 | * | 11/2006 | Bezama et al. | 361/699 |
| 7,190,580 B2 | * | 3/2007 | Bezama et al. | 361/699 |

OTHER PUBLICATIONS

Miller et al., "A Novel Strategy for the Integration of PDMS Membranes into Thermoplastic Microfluidic Packages", IEEE 55th Electrical Components and Technology Conference, Lake Buena Vista, Flordia, May 31-Jun. 3, 2005, pp. 597-602.

* cited by examiner

*Primary Examiner*—Jayprakash Gandhi
*Assistant Examiner*—Robert J. Hoffberg
(74) *Attorney, Agent, or Firm*—Matthew J. Bussan

(57) ABSTRACT

A chip module heat transfer apparatus includes one or more chips electronically connected to a module substrate by controlled collapse chip connection (C4) solder joints. The module substrate, which is preferably an FR-4 laminate or other organic substrate, has cut-out channels formed thereon. A permanent solder mask is laminated over the cut-out channels to form thermal dissipation channels, which are in fluid communication with input and output ports. The C4 solder joints include solder balls that electronically connect terminals on the chips to corresponding attach pads on the substrate that are exposed through the mask. The thermal dissipation channels extend along rows of attach pads. A cooling fluid, such as inert perfluorocarbon fluid, flows through the thermal dissipation channels to remove heat and to mitigate strain on the solder balls due to coefficient of thermal expansion (CTE) mismatch between the chips and the substrate.

18 Claims, 6 Drawing Sheets

US 7,298,623 B1

ORGANIC SUBSTRATE WITH INTEGRAL THERMAL DISSIPATION CHANNELS, AND METHOD FOR PRODUCING SAME

BACKGROUND OF THE INVENTION

1. Field of Invention

The present invention relates in general to the field of electronic packaging. More particularly, the present invention relates to electronic packaging that removes heat from an electronic component using thermal dissipation channels of an organic substrate.

2. Background Art

Electronic components, such a microprocessors and integrated circuits, must operate within certain specified temperature ranges to perform efficiently. Excessive heat degrades electronic component performance, reliability, life expectancy, and can even cause failure. Heat sinks are widely used for controlling excessive heat. Typically, heat sinks are formed with fins, pins or other similar structures to increase the surface area of the heat sink and thereby enhance heat dissipation as air passes over the heat sink. In addition, it is not uncommon for heat sinks to contain high performance structures, such as vapor chambers and/or heat pipes, to further enhance heat transfer. Heat sinks are typically formed of metals, such as copper or aluminum. More recently, graphite-based materials have been used for heat sinks because such materials offer several advantages, such as improved thermal conductivity and reduced weight.

However, the heat dissipation performance of conventional heat sinks, even when augmented with high performance structures and the use of exotic materials, may not be enough to prevent excessive heat buildup in the electronic component and/or the underlying substrate in some applications, such as in a multi-chip module that requires high power density. For example, excessive heat buildup in the module substrate of a multi-chip module can be a problem when an organic substrate, such as polyimide or other polymer(s), FR-4 (i.e., glass-epoxy laminate), etc., is used in lieu of a ceramic carrier, glass-ceramic substrate, or other conductor-carrying substrate that can withstand higher temperatures. Moreover, excessive heat buildup exacerbates another problem associated with using organic substrates, which is discussed below, relating to the mismatch in the coefficient of thermal expansion (CTE) of organic substrates relative to that of silicon chips. Hence, organic substrates are typically not used as module substrates in multi-chip modules, even though organic substrates are typically much less costly than ceramic carriers, glass-ceramic substrates, and the like.

Electronic components are generally packaged using electronic packages (i.e., modules) that include a module substrate to which one or more electronic component(s) is/are electronically connected. A single-chip module (SCM) contains a single electronic component such as a central processor unit (CPU), memory, application-specific integrated circuit (ASIC) or other integrated circuit. A multi-chip module (MCM), on the other hand, contains two or more such electronic components.

Generally, each of these electronic components takes the form of a flip-chip, which is a semiconductor chip or die having an array of spaced-apart terminals or pads on its base to provide base-down mounting of the flip-chip to the module substrate. The module substrate is typically a ceramic carrier, glass-ceramic substrate, or other conductor-carrying substrate. As mentioned above, organic substrates are generally not used as module substrates because of their inability to withstand higher temperatures and because of the typically large CTE mismatch between organic substrates and flip-chips. This is disadvantageous because, as mentioned above, organic substrates are typically much less costly than ceramic carriers, glass-ceramic substrates, and the like. Typically, ceramic carriers have a CTE (e.g., CTE=2-7 ppm/° C.) much closer to that of flip-chips (e.g., CTE=2-3 ppm/° C.) than do organic substrates (e.g., CTE=12-20 ppm/° C.). In general, the larger the base area of the flip-chip the more problematic the CTE mismatch becomes. Hence, organic substrates are typically not used as module substrates, especially for relatively large flip-chips, because of the substantial strain on the solder balls (which interconnect the flip-chip and the module substrate as discussed below) due to CTE mismatch.

Moreover, the problems associated with the use of organic substrates due to CTE mismatch are exacerbated by any excessive heat buildup in the organic substrate due to heat dissipation performance limitations of the heat sink as discussed above. Excessive heat buildup acts to magnify the strain on the solder balls due to CTE mismatch between the organic substrate and the flip-chip.

Controlled collapse chip connection (C4) solder joints (also referred to as "solder bumps") are typically used to electrically connect the terminals or pads on the base of the flip-chip with corresponding terminals or pads on the module substrate. C4 solder joints are disposed on the base of the flip-chip in an array of minute solder balls (e.g., on the order of 100 µm diameter and 200 µm pitch). The solder balls, which are typically lead (Pb)-containing solder, are reflowed to join (i.e., electrically and mechanically) the terminals or pads on the base of the flip-chip with corresponding terminals or pads on the module substrate.

Typically, a non-conductive polymer underfill is disposed in the space between the base of the flip-chip and the module substrate and encapsulates the C4 solder joints. The C4 solder joints are embedded in this polymeric underfill and are thus protected from corrosion caused by corrosion inducing components such as moisture and carbon dioxide in the air. In addition, the polymeric underfill provides mechanical rigidity and electrical isolation.

FIG. 1 illustrates an example of a conventional multi-chip module assembly 100 that utilizes C4 solder joints. FIG. 2 is an enlarged view of the C4 solder joints of the conventional multi-chip module assembly 100. In many computer and other electronic circuit structures, an electronic module is electrically connected to a printed circuit board (PCB). For example, the conventional multi-chip module assembly 100 shown in FIGS. 1 and 2 includes capped module 105 electrically connected to a PCB 110. Generally, in connecting an electronic module to a PCB, a plurality of individual electrical contacts on the base of the electronic module must be connected to a plurality of corresponding individual electrical contacts on the PCB. Various technologies well known in the art are used to electrically connect the set of contacts on the PCB and the electronic module contacts. These technologies include land grid array (LGA), ball grid array (BGA), column grid array (CGA), pin grid array (PGA), and the like. In the illustrative example shown in FIG. 1, a LGA 115 electrically connects PCB 110 to a module substrate 120. LGA 115 may comprise, for example, conductive elements 116, such as fuzz buttons, retained in a non-conductive interposer 117.

In some cases, the module includes a cap (i.e., a capped module) which seals the electronic component(s) within the module. The module 105 shown in FIG. 1 is a capped module. In other cases, the module does not include a cap (i.e., a bare die module). In the case of a capped module, a heat sink is typically attached with a thermal interface between a bottom surface of the heat sink and a top surface of the cap, and another thermal interface between a bottom surface of the cap and a top surface of the electronic component(s). For example, as shown in FIG. 1, a heat sink 150 is attached with a thermal interface 155 between a bottom surface of heat sink 150 and a top surface of a cap 160, and another thermal interface 165 between a bottom surface of cap 160 and a top surface of each flip-chip 170. In addition, a heat spreader (not shown) may be attached to the top surface of each flip-chip 170 to expand the surface area of thermal interface 165 relative to the surface area of the flip-chip 170. The heat spreader, which is typically made of a highly thermally conductive material such as SiC, is typically adhered to the top surface of the flip-chip 170 with a thermally-conductive adhesive. Typically, a sealant 166 (e.g., a silicone adhesive such as Sylgard 577) is applied between cap 160 and module substrate 120 to seal the chip cavity 167. In the case of a bare die module, a heat sink is typically attached with a thermal interface between a bottom surface of the heat sink and a top surface of the electronic component(s). Heat sinks are attached to modules using a variety of attachment mechanisms, such as adhesives, clips, clamps, screws, bolts, barbed push-pins, load posts, and the like.

Capped module 105 includes a module substrate 120, a plurality of flip-chips 170, LGA 115, and cap 160. In addition, capped module 105 includes C4 solder joints 175 electronically connecting each flip-chip 170 to module substrate 120. As best seen in FIG. 2, capped module 110 also includes a non-conductive polymer underfill 180 which is disposed in the space between the base of each flip-chip 170 and module substrate 120 and encapsulates the C4 solder joints 175.

Module substrate 120 is typically a ceramic carrier, glass-ceramic substrate, or other conductor-carrying substrate that can withstand higher temperatures. As discussed above, organic substrates are typically not used as module substrates because of the inability of organic substrates to withstand higher temperatures and because of the typically large CTE mismatch between organic substrates and flip-chips. Moreover, the problems associated with the use of organic substrates due to CTE mismatch are exacerbated by any excessive heat buildup. This is disadvantageous because organic substrates are typically much less costly than ceramic carriers, glass-ceramic substrates, and the like.

Therefore, a need exists for an enhanced method and apparatus for removing heat from an electronic component mounted on an organic substrate.

SUMMARY OF THE INVENTION

According to the preferred embodiments of the present invention, a chip module heat transfer apparatus includes one or more chips electronically connected to a module substrate by controlled collapse chip connection (C4) solder joints. The module substrate, which is preferably an FR-4 laminate or other organic substrate, has cut-out channels formed thereon. A permanent solder mask is laminated over the cut-out channels to form thermal dissipation channels, which are in fluid communication with input and output ports. The C4 solder joints include solder balls that electronically connect terminals on the chips to corresponding attach pads on the module substrate that are exposed through the permanent solder mask. The thermal dissipation channels extend along rows of attach pads. A cooling fluid, such as an inert perfluorocarbon fluid, flows through the thermal dissipation channels to remove heat and to mitigate strain on the solder balls due to coefficient of thermal expansion (CTE) mismatch between the chips and the substrate.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

1. Overview

In accordance with the preferred embodiments of the present invention, a chip module heat transfer apparatus includes one or more chips electronically connected to a module substrate by controlled collapse chip connection (C4) solder joints. The module substrate, which is preferably an FR-4 laminate or other organic substrate, has cut-out channels formed thereon. A permanent solder mask is laminated over the cut-out channels to form thermal dissipation channels, which are in fluid communication with input and output ports. The C4 solder joints include solder balls that electronically connect terminals on the chips to corresponding attach pads on the module substrate that are exposed through the permanent solder mask. The thermal dissipation channels extend along rows of attach pads. A cooling fluid, such as an inert perfluorocarbon fluid, flows through the thermal dissipation channels to remove heat and to mitigate strain on the solder balls due to coefficient of thermal expansion (CTE) mismatch between the chips and the substrate.

2. Detailed Description

Figure 1:
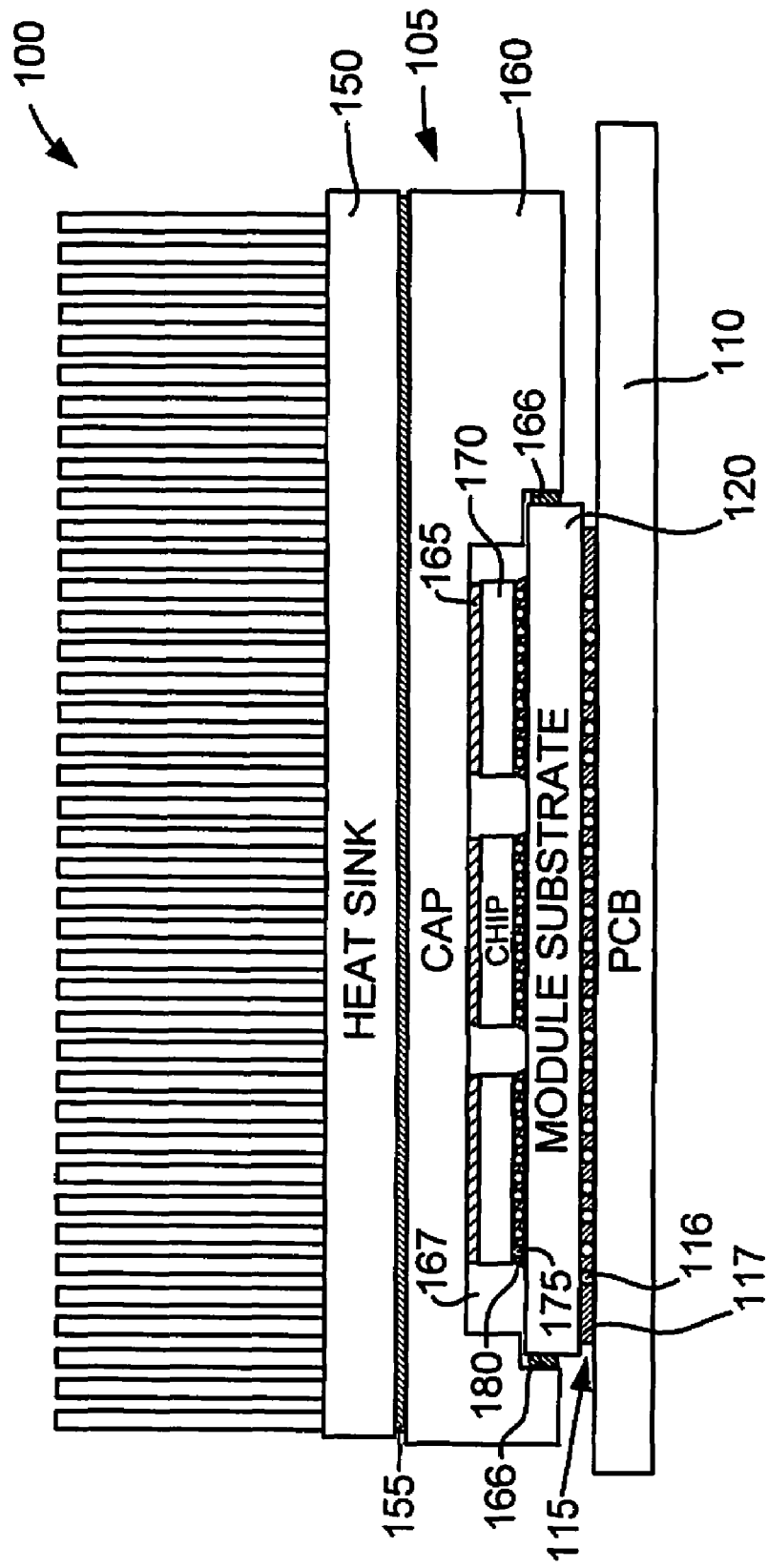
FIG. 1 is a sectional view of a conventional multi-chip module assembly that utilizes a module substrate, one side of which is electrically connected to a plurality of chips through C4 solder joints, and the other side of which is electrically connected to a PCB through a LGA.
Figure 2:
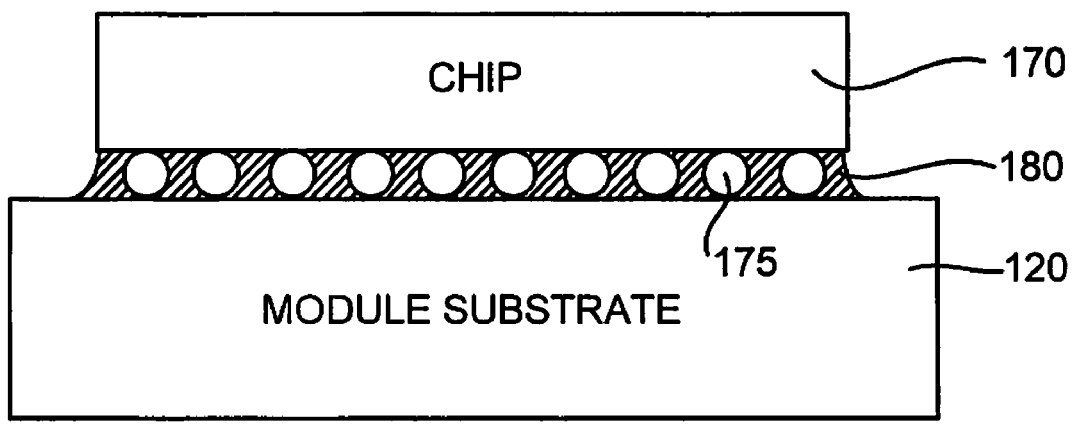
FIG. 2 is an enlarged sectional view of the C4 solder joints of the conventional multi-chip module assembly shown in FIG. 1.
Figure 3:
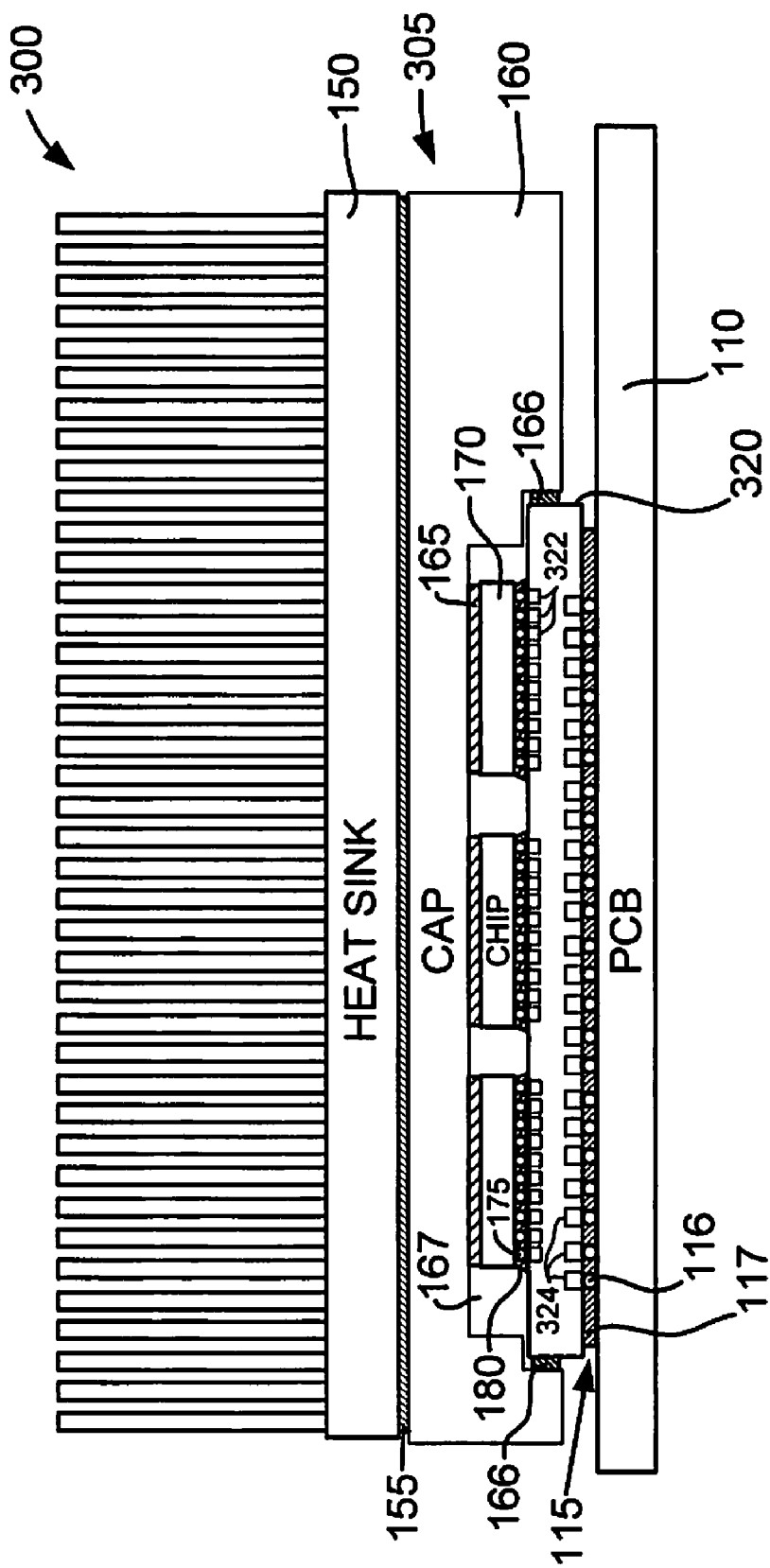
FIG. 3 is a sectional view of a multi-chip module assembly that utilizes a module substrate having integral thermal dissipation channels according to the preferred embodiments of the present invention.

Referring now to FIG. 3, there is depicted, in a sectional view, a multi-chip module assembly 300 that utilizes a module substrate having integral thermal dissipation channels according to the preferred embodiments of the present invention. The multi-chip module assembly 300 shown in FIG. 3 is similar to the conventional multi-chip module assembly 100 shown in FIG. 1, but the module substrate 120 shown in FIG. 1 is replaced in FIG. 3 with a module substrate 320 having integral thermal dissipation channels according to the preferred embodiments of the present invention. In the embodiment shown in FIG. 3, module substrate 320 includes a plurality of upper thermal dissipation channels 322 and a plurality of lower thermal dissipation channels 324. Upper thermal dissipation channels 322 and lower thermal dissipation channels 324 are microfluidic channels etched into module substrate 320 and define a portion of one or more recirculation loops used to circulate coolant through the module substrate. This additional cooling in the module substrate reduces the limits placed on heat sink external resistance values during processing and hence increases the efficiency of the processors. In addition, this additional cooling in the module substrate mitigates strain on the solder balls due to coefficient of thermal expansion (CTE) mismatch between the processor chips and the module substrate.

Upper thermal dissipation channels 322 remove heat from the upper side of module substrate 320 which, as discussed below, includes C4 attach pads for electrically connecting the module substrate to a plurality of chips via C4 solder joints. In the embodiment shown in FIG. 3, one upper thermal dissipation channel 322 extends along each row of C4 attach pads. This configuration of the upper thermal dissipation channels is exemplary. Those skilled in the art will appreciate that the methods and apparatus of the present invention can also be applied to other configurations of the upper thermal dissipation channels. For example, the upper thermal dissipation channels may be configured to extend along selected rows of C4 attach pads, or may be configured to each extend along a plurality of rows of C4 attach pads, or may be configured to each extend between adjacent rows of C4 attach pads.

Lower thermal dissipation channels 324 remove heat from the lower side of module substrate 320 which, as discussed below, includes LGA attach pads for electrically connecting the module substrate to a PCB via an array of conductive elements such as fuzz buttons. In the embodiment shown in FIG. 3, one lower thermal dissipation channel 324 extends along each row of LGA attach pads. This configuration of the lower thermal dissipation channels is exemplary. Those skilled in the art will appreciate that the methods and apparatus of the present invention can also be applied to other configurations of the lower thermal dissipation channels. For example, the lower thermal dissipation channels may be configured to extend along selected rows of LGA attach pads, or may be configured to each extend along a plurality of rows of LGA attach pads, or may be configured to each extend between adjacent rows of LGA attach pads. Likewise, the upper or lower thermal dissipation channels may be omitted.

Moreover, the multi-chip module assembly shown in FIG. 3 is exemplary. Those skilled in the art will appreciate that the methods and apparatus of the present invention can also apply to configurations differing from the multi-chip module assembly shown in FIG. 3, to other types of chip modules, and generally to other conductor-carrying substrates. For example, in lieu of being applied to a module substrate having C4 attach pads and LGA attach pads, such as module substrate 320 shown in FIG. 3, the methods and apparatus of the present invention can also be applied to an organic substrate having pin thru hole (PTH) technology connectors.

Some of the elements of multi-chip module assembly 300 shown in FIG. 3 are identical to those discussed above with respect to the conventional multi-chip module assembly 100 shown in FIG. 1. Those identical elements are discussed briefly again below, along with a detailed discussion of elements unique to the present invention.

Preferably, module substrate 320 is an organic substrate, such as polyimide or other polymer(s), FR-4 (i.e., composite laminate of a resin epoxy reinforced with a woven fiberglass mat), and the like. As discussed above in the Background Art section, organic substrates are typically much less costly than ceramic carriers and glass-ceramic substrates but organic substrates are generally not used as module substrates because of the inability of organic substrates to withstand higher temperatures and because of the typically large coefficient of thermal expansion (CTE) mismatch between organic substrates and flip-chips. Typically, ceramic carriers have a CTE (e.g., CTE=2-7 ppm/° C.) much closer to the CTE of flip-chips (e.g., CTE=2-3 ppm/° C.) as compared to the CTE of organic substrates (CTE=12-20 ppm/° C.). In general, the larger the base area of the flip-chip the more problematic the CTE mismatch becomes. Hence, organic substrates are typically not used as module substrates, especially for relatively large flip-chips, because of the substantial strain on the C4 solder joints due to CTE mismatch. The present invention solves these problems by flowing a cooling fluid, such as an inert perfluorocarbon fluid, through thermal dissipation channels integrally formed in the organic substrate to remove heat and mitigate strain induced by the CTE mismatch.

Multi-chip module assembly 300 includes a capped module 305 electrically connected to a PCB 110. Generally, as mentioned earlier, in connecting an electronic module to a PCB, a plurality of individual electrical contacts on the base of the electronic module must be connected to a plurality of corresponding individual electrical contacts on the PCB. Various technologies well known in the art are used to electrically connect the set of contacts on the PCB and the electronic module contacts. These technologies include land grid array (LGA), ball grid array (BGA), column grid array (CGA), pin grid array (PGA), and the like. In the illustrative example shown in FIG. 3, a LGA 115 electrically connects PCB 110 to a module substrate 320. LGA 115 may comprise, for example, conductive elements 116, such as fuzz buttons, retained in a non-conductive interposer 117. One skilled in the art will appreciate, however, that any of the various other technologies may be used in lieu of, or in addition to, such LGA technology.

Preferably, as shown in FIG. 3, module 305 includes a cap 160 (i.e., module 305 is a "capped module"). In the case of a capped module, a heat sink is typically attached with a thermal interface between a bottom surface of the heat sink and a top surface of the cap, and another thermal interface between a bottom surface of the cap and a top surface of the electronic component(s). For example, as shown in FIG. 3, a heat sink 150 is attached with a thermal interface 155 between a bottom surface of heat sink 150 and a top surface of a cap 160, and another thermal interface 165 between a bottom surface of cap 160 and a top surface of each flip-chip 170. In addition, a heat spreader (not shown) may be attached to the top surface of each flip-chip 170 to expand the surface area of thermal interface 165 relative to the surface area of the flip-chip 170. The heat spreader, which is typically made of a highly thermally conductive material such as SiC, is typically adhered to the top surface of the flip-chip 170 with a thermally-conductive adhesive. Typically, a sealant 166 (e.g., a silicone adhesive such as Sylgard 577) is applied between cap 160 and module substrate 320 to seal the chip cavity 167.

Heat sink 150 is attached to module 305 using a thermally-conductive adhesive to form thermal interface 155. Although not shown for the sake of clarity, heat sink 150 is also attached to module 305 through a conventional LGA mounting mechanism. In this regard, heat sink 150 includes a plurality of bolts or load posts (not shown) that project from the bottom surface of heat sink 150. Typically, one bolt or load post is positioned on each side of the generally square or rectangular footprint of module cavity 167. The bolts or load posts pass through correspondingly positioned throughholes (not shown) in cap 160, PCB 110, and an insulated steel backup plate (not shown). As is well known in the art, the bolts or load posts cooperate with one or more compression springs (not shown) to urge assembly 300 together with force sufficient to make the electrical connections of LGA 115. Alternatively, those skilled in the art will recognize that other attachment mechanisms may be used. Generally, heat sinks, PCBs and the like, are attached to modules using a variety of attachment mechanisms, such as adhesives, clips, clamps, screws, bolts, barbed push-pins, load posts, and the like.

As mentioned above, the module may alternatively be a "bare die module" that does not include a cap. In this "bare die module" alternative case, a heat sink is attached with a thermal interface between a bottom surface of the heat sink and a top surface of each flip-chip. In addition, a heat spreader may be attached to the top surface of each flip-chip to expand the surface area of the thermal interface relative to the surface area of the flip-chip. In the "bare die module" alternative case, a non-conductive spacer frame extends between a bottom surface of the heat sink and the top surface of the PCB. Rather than being defined by surfaces of the cap, the module cavity in this alternative case would be defined by surfaces of the non-conductive spacer frame and the heat sink. Also, in the "bare die module" alternative case a butyl rubber gasket would be seated along the periphery of the non-conductive spacer frame to seal the electronic component(s) within the module cavity.

Capped module 305 includes module substrate 320, a plurality of flip-chips 170, LGA 115, and cap 160. In addition, capped module 305 includes C4 solder joints 175 (best seen in FIG. 4) electrically connecting each flip-chip 170 to module substrate 320. Capped module 305 also includes a non-conductive polymer underfill 180 (best seen in FIG. 4) which is disposed in the space between the base of each flip-chip 170 and a cover layer 410, discussed below, which is provided on an upper surface of substrate 320. The non-conductive polymer 180 encapsulates the C4 solder joints 175.

Figure 4:
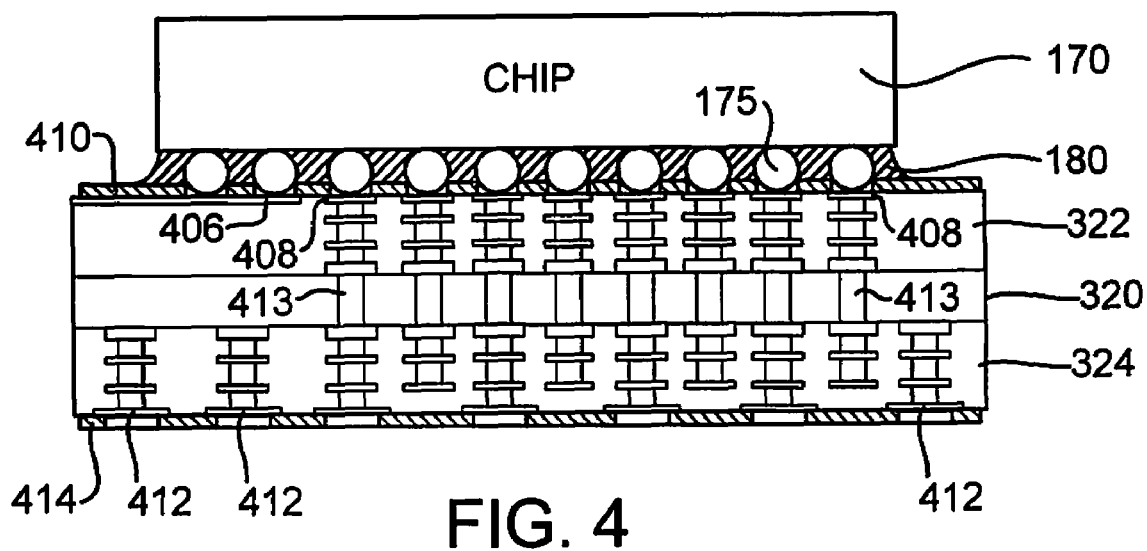
FIG. 4 is an enlarged sectional view of the module substrate of the multi-chip module assembly shown in FIG. 3, along an upper thermal dissipation channel and a lower thermal dissipation channel.

FIG. 4 is an enlarged sectional view of module substrate 320 of the multi-chip module assembly shown in FIG. 3, along one of upper thermal dissipation channels 322 and one of lower thermal dissipation channels 324. The upper thermal dissipation channel 322 as shown in FIG. 4 is integrally formed in the upper end of module substrate 320 and extends along a row of C4 attach pads 406,408. A cover layer 410 is provided on the top surface of module substrate 320 and encloses cut out channels on the top surface of module substrate 320 to form upper thermal dissipation channels 322. Preferably, cover layer 410 is a permanent solder mask (e.g., epoxy, acrylate, and the like) laminated to the top surface of module substrate 320. The C4 attach pads 406, 408 are exposed through cover layer 410, but cover layer 410 is retained around the periphery of each C4 attach pad 406,408 so that a sealed relationship is maintained between C4 attach pads 406, 408 and cover layer 410. Hence, the upper surface of upper thermal dissipation channel 322 is defined by the sealed combination of C4 attach pads 406,408 and cover layer 410.

Similarly, the lower thermal dissipation channel 324 as shown in FIG. 4 is integrally formed in the lower end of module substrate 320 and extends along a row of LGA attach pads 412. As is conventional, conductive vias 413 extend through module substrate 320 to electrically connect C4 attach pads 408 to LGA attach pads 412. A cover layer 414 is provided on the bottom surface of module substrate 320 and encloses cut out channels on the bottom surface of module substrate 320 to form lower thermal dissipation channels 324. Preferably, cover layer 414 is a permanent solder mask (e.g., epoxy, acrylate, and the like) laminated to the bottom surface of module substrate 320. The LGA attach pads 412 are exposed through cover layer 414, but cover layer 414 is retained around the periphery of each LGA attach pad 412 so that a sealed relationship is maintained between LGA attach pads 412 and cover layer 414. Hence, the lower surface of lower thermal dissipation channel 324 is defined by the sealed combination of LGA attach pads 412 and cover layer 414.

Those skilled in the art will appreciate that the methods and apparatus of the present invention can also be applied to configurations of the upper and lower thermal dissipation channels other than shown in FIG. 4. For example, the upper and/or lower thermal dissipation channels may be routed differently than shown in FIG. 4 (e.g., the upper thermal dissipation channels may be routed to extend perpendicular to the lower thermal dissipation channels). Also, additional thermal dissipation channels may be provided (e.g., one or more intermediate thermal dissipation channels may be provided between the upper and lower thermal dissipation channels), and/or either the upper or lower thermal dissipation channels may be omitted.

Figure 5:
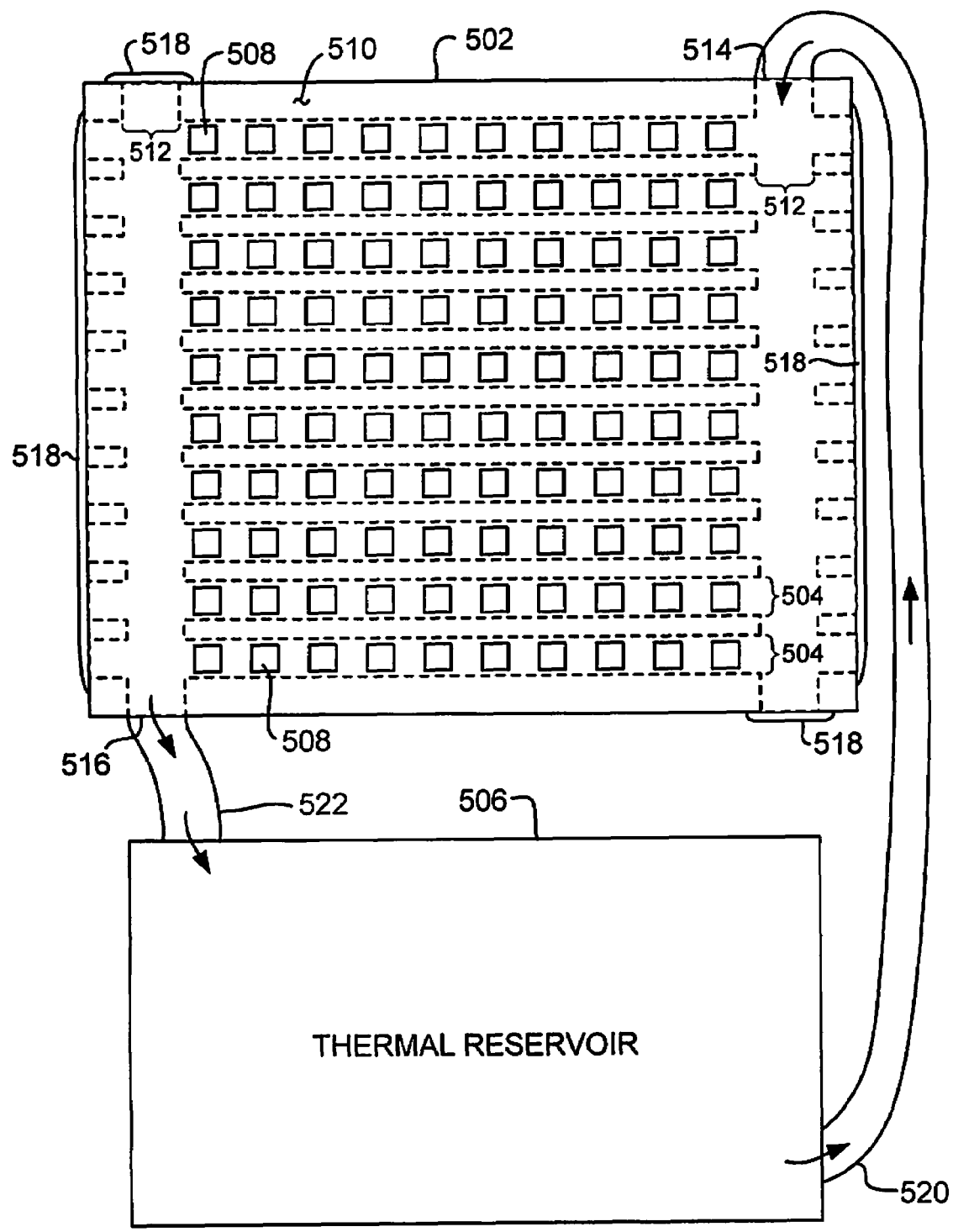
FIG. 5 is a top view of a module substrate having integral thermal dissipation channels in fluid communication with a thermal reservoir according to the preferred embodiments of the present invention.

FIG. 5 is a top view of a module substrate 502 having integral thermal dissipation channels 504 (shown in dotted lines) in fluid communication with a thermal reservoir 506 according to the preferred embodiments of the present invention. Module substrate 502 is shown in FIG. 5 prior to electrically connecting a flip-chip thereto. The flip-chip is to be connected to an array of C4 solder joints 508 exposed though a cover layer 510 provided on the top surface of module substrate 502. The thermal dissipation channels 504 shown in FIG. 5 correspond to upper thermal dissipation channels 322 shown in FIGS. 3 and 4. The thermal dissipation channels 504 are shown in FIG. 5 as dotted lines because they are hidden under cover layer 510. Each thermal dissipation channel 504 extends along a row of C4 attach pads 508 and intersect peripheral channels 512. Thermal dissipation channels 504 are in fluid communication with an input port 514 and an output port 516 via peripheral channels 512. A sealant 518 is provided on the end faces of module substrate 502 to cap thermal dissipation channels 504 and peripheral channels 512. The sealant may be, for example, epoxy, silicone, and the like.

A cooling fluid is preferably pumped from thermal reservoir 506 through a supply conduit 520 to input port 514 of module substrate 502, where the cooling fluid picks up heat as it travels through thermal dissipation channels 504. From the perspective shown in FIG. 5, the cooling fluid flows through thermal dissipation channels 504 right to left. Then, the cooling fluid is exhausted from outlet port 516 of module substrate 502 through an exhaust conduit 522 and returns to thermal reservoir 506, where the cooling fluid is cooled for recirculation. To provide additional cooling, reservoir 506 may be thermally attached to a heat sink, e.g., attached to the underside of heat sink 150 shown in FIG. 3 or an additional heat sink, or connected to a heat pipe, waterfall, or other conventional cooling mechanism. The cooling fluid may be any suitable coolant, for example, an inert perfluorocarbon fluid, such as 3M Fluorinert commercially available from 3M Company, St. Paul, Minn. Although not shown in FIG. 5, a pump is preferably provided to force the cooling fluid through the recirculation loop. Alternatively, the cooling fluid may move passively through the recirculation loop, e.g., by convection.

Supply conduit 520 and exhaust conduit 522 are respectively attached to input port 514 and outlet port 516 using any suitable conventional fastening technique, such as by inserting and sealing tubular fittings (not shown) into the ends of peripheral channels 512 at input port 514 and outlet port 516, and then mating supply conduit 520 and exhaust conduit 522 over the tubular fittings to provide a tight seal. Supply conduit 520 and exhaust conduit 522 may be rubber, metal or some other suitable material that is compatible with the coolant.

In general, the rate of heat transfer can be controlled by using various thermal transport media in the internal structure of the module substrate. For example, the rate of heat transfer can be controlled by varying the composition and/or the flow rate of the cooling fluid. Also, the rate of heat transfer is a function of the configuration of the thermal dissipation channels within the module substrate.

Although not shown in FIG. 5, module 502 may include intermediate and/or lower thermal dissipation channels. For example, module 502 may include lower thermal dissipation channels that correspond to lower thermal dissipation channels shown in FIGS. 3 and 4. The direction of flow of the cooling fluid in these additional channels may be concurrent, opposite and/or perpendicular to the direction of flow of the cooling liquid in thermal dissipation channels 504.

Figure 6:
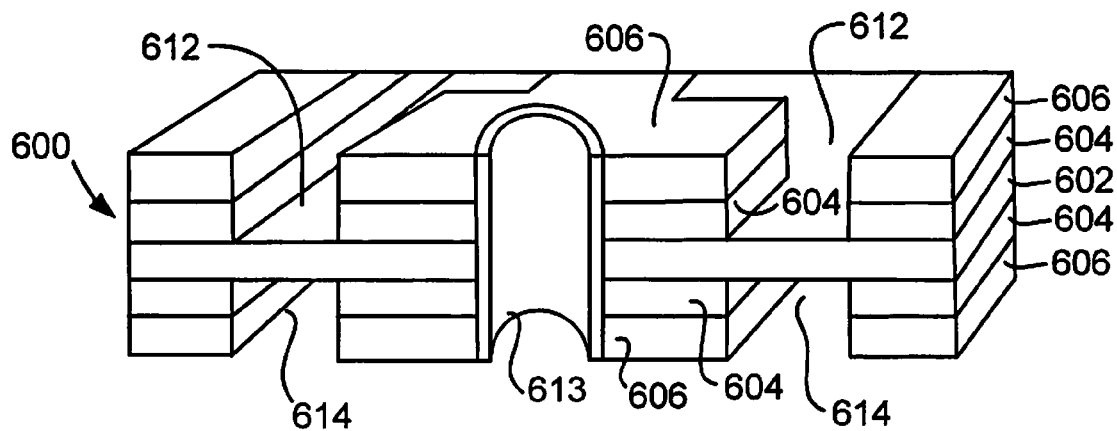
FIG. 6 is a sectional view of an organic substrate having cut-out channels formed on the top and bottom surfaces thereof, prior to laminating a permanent solder mask over the top and bottom surfaces, according to the preferred embodiments of the present invention.

FIG. 6 is a partial, sectional view of an organic substrate 600 having cut-out channels formed on the top and bottom surfaces thereof, prior to laminating a permanent solder mask over the top and bottom surfaces, according to the preferred embodiments of the present invention. FIG. 6 is a partial view in that it shows only a relatively small area of organic substrate 600 containing cut-out channels in the vicinity of a single pin-through-hole (PTH) technology connector. Those skilled in the art will appreciate that substrate 600 may contain many such connectors, and that the cut-out channels may extend from connector to connector. Likewise, those skilled in the art will appreciate that the methods and apparatus of the present invention can also be applied to substrates that contain other types of connectors, such as C4 attach pads, and as well to substrates that are not organic, such as ceramic carriers, glass-ceramic substrates, and the like.

Organic substrate 600 preferably includes an FR-4 laminate 602 sandwiched between a pair of Cu foil layers 604 and a pair of electrolytic Cu layers 606. Upper cut-out channels 612 are formed on the top surface of substrate 600 by etching away selective portions of electrolytic Cu layer 606 and Cu foil layer 604. Lower cut-out channels 614 are formed on the bottom surface of substrate 600 by etching away selective portions of electrolytic Cu layer 606 and Cu foil layer 604. Upper cut-out channels 612 and lower cut-out channels 614 are formed using conventional photolithographic processes, such as photomask exposure and the like. Preferably, upper cut-out channels 612 and lower cut-out channels 614 are positioned to substantially surround a connector, such as the PTH technology connector 613 as shown in FIG. 6. This arrangement of the cut-out channels efficiently removes heat from the connector when a coolant flows through the channels. Those skilled in the art will appreciate, however, that the methods and apparatus of the present invention can also be applied to other arrangements of the cut-out channels.

In addition to, or in lieu of, etching away selective portions of electrolytic Cu layer 606 and Cu foil layer 604, selective portions of non-conductive layers (not shown in FIG. 6) of substrate 600 may be etched away to form the upper cut-out channels 612 and/or lower cut-out channels 614. For example, the upper cut-out channels 612 and/or the lower cut-out channels 614 shown in FIG. 6 may be extended from connector 613 to an adjacent connector (not shown in FIG. 6) by etching away selective portions of non-conductive layers (not shown in FIG. 6) that lie between those two connectors. Likewise, the upper cut-out channel and/or the lower cut-out channel may be formed by etching away selective portions of non-conductive layers of the substrate, e.g., by etching away selective portions of non-conductive layers of the substrate between contacts or in moat-like fashion around the periphery of an array of connectors.

Figure 7:
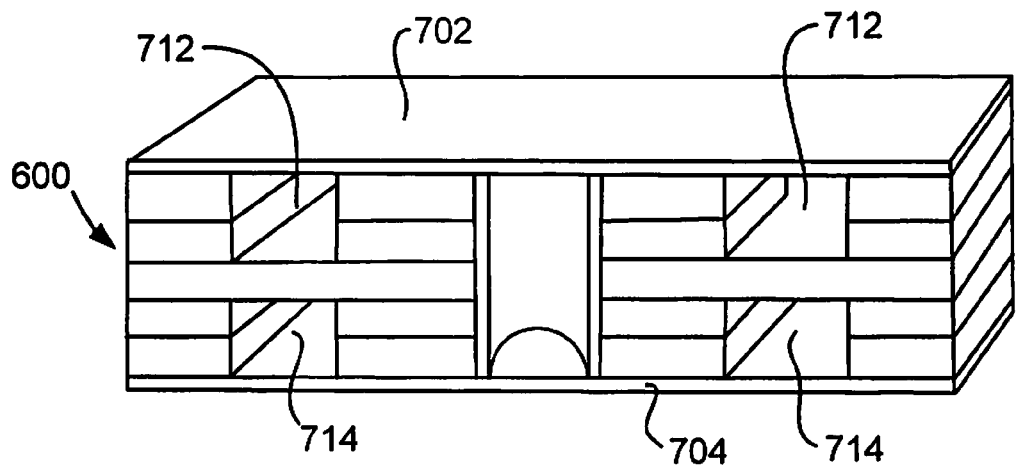
FIG. 7 is a sectional view similar to FIG. 6 but showing a permanent solder mask laminated to the top and bottom surfaces of the organic substrate to enclose the cut-out channels and thereby form thermal dissipation channels according to the preferred embodiments of the present invention.

FIG. 7 is a sectional view similar to FIG. 6 but showing a permanent solder mask 702,704 laminated to the top and bottom surfaces of organic substrate 600 to enclose the cut-out channels 612,614 and thereby form thermal dissipation channels 712, 714 according to the preferred embodiments of the present invention. Permanent solder masks 702, 704 may be epoxy, acrylate, or other suitable material, that is laminated to electrolytic Cu layer 606 (and any other layers of substrate 600 that are co-planar with electrolytic Cu layer 606) by, for example, hot roll lamination, vacuum lamination, dip coating, and the like.

Figure 8:
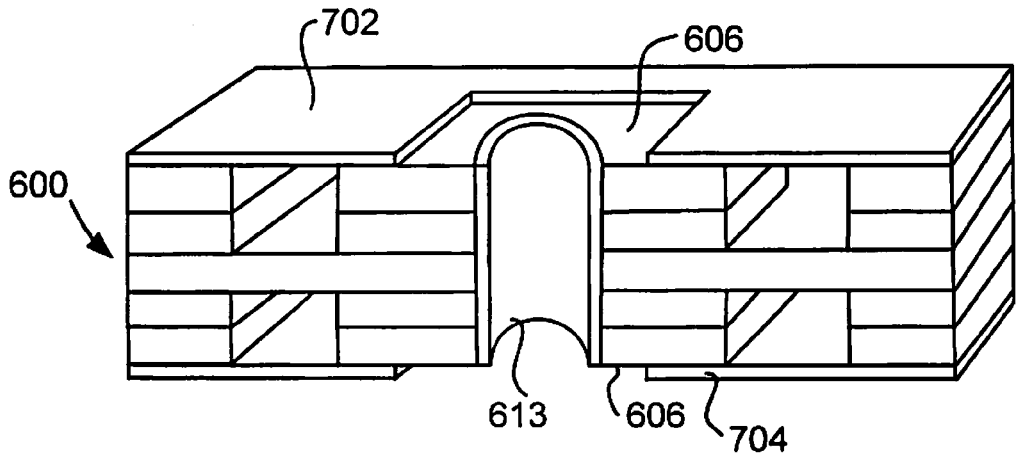
FIG. 8 is a sectional view similar to FIG. 7 but showing selective portions of the permanent solder mask removed to expose a PTH technology connector according to the preferred embodiments of the present invention.

FIG. 8 is a sectional view similar to FIG. 7 but showing selective portions of the permanent solder mask 702,704 removed to expose PTH technology connector 613 according to the preferred embodiments of the present invention. Preferably, these selective portions of permanent solder mask 702,704 are removed by conventional lithographic techniques, such as photomask exposure and the like. Connector 613 is exposed through permanent solder masks 702,704, but permanent solder masks 702,704 are retained in contact with electrolytic Cu layers 606 so that a sealed relationship is maintained between electrolytic Cu layers 606 and permanent solder masks 702, 704.

One skilled in the art will appreciate that many variations are possible within the scope of the present invention. For example, the methods and apparatus of the present invention can also apply to configurations differing from the multichip module assembly shown in FIG. 3, as well as to other types of chip modules and other conductor-carrying substrates. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. A substrate heat transfer apparatus, comprising:
a conductor-carrying substrate having a top surface, wherein one or more cut-out channels are formed on the top surface of the substrate;
a cover layer provided on the top surface of the substrate, wherein the cover layer encloses the one or more cut-out channels to form one or more thermal dissipation channels, and wherein the one or more thermal dissipation channels are in fluid communication with an input port and an output port;
wherein the top surface of the substrate includes attach pads arranged in rows and exposed through the cover layer, and wherein at least a portion of a first one of the one or more thermal dissipation channels extends along the entire extent of a first row of the attach pads, and wherein the cover layer overlies in a sealed relationship a portion of each of the attach pads in the first row so that an upper surface of the first one of the one or more thermal dissipation channels is at least partially defined by the sealed combination of the cover layer and the attach pads in the first row.

2. The substrate heat transfer apparatus as recited in claim 1, wherein the substrate includes an organic substrate.

3. The substrate heat transfer apparatus as recited in claim 2, wherein the organic substrate includes an FR-4 epoxy-glass laminate.

4. The substrate heat transfer apparatus as recited in claim 1, wherein the cover layer includes a permanent solder mask.

5. The substrate heat transfer apparatus as recited in claim 4, wherein the permanent solder mask is laminated to the top surface of the substrate and includes a material selected from a group consisting of epoxy, acrylate, and combinations thereof.

6. The substrate heat transfer apparatus as recited in claim 1, wherein the attach pads include controlled collapse chip connection (C4) attach pads.

7. The substrate heat transfer apparatus as recited in claim 1, further comprising a sealant provided on an end face of the substrate, wherein the sealant caps one or more of the thermal dissipation channels.

8. The substrate heat transfer apparatus as recited in claim 7, wherein the sealant includes a material selected from a group consisting of epoxy, silicone, and combinations thereof.

9. The substrate heat transfer apparatus as recited in claim 1, wherein the first one of the one or more thermal dissipation channels substantially surrounds each of the attach pads in the first row.

10. A chip module heat transfer apparatus, comprising:
an organic substrate having a top surface, wherein one or more cut-out channels are formed on the top surface of the organic substrate;
a cover layer provided on the top surface of the organic substrate, wherein the cover layer includes a permanent solder mask that encloses the one or more cut-out channels to form one or more thermal dissipation channels in fluid communication with an input port and an output port, wherein the top surface of the organic substrate includes controlled collapse chip connection (C4) attach pads exposed through the cover layer, and wherein at least a portion of a first one of the one or more thermal dissipation channels extends along the entire extent of a row of the C4 attach pads, and wherein the cover layer overlies in a sealed relationship a portion of each of the C4 attach pads in the row so that an upper surface of the first one of the one or more thermal dissipation channels is at least partially defined by the sealed combination of the cover layer and the C4 attach pads in the row;
a plurality of chips electrically connected to the C4 attach pads by C4 solder joints.

11. The chip module heat transfer apparatus as recited in claim 10, wherein the input and output ports are connected to a reservoir containing cooling fluid that flows through the one or more thermal dissipation channels.

12. The chip module heat transfer apparatus as recited in claim 11, wherein the cooling fluid is an inert perfluorocarbon fluid.

13. The chip module heat transfer apparatus as recited in claim 10, further comprising a heat sink in thermal contact with the chips.

14. The chip module apparatus as recited in claim 10, wherein the organic substrate includes an FR-4 epoxy-glass laminate.

15. The chip module heat transfer apparatus as recited in claim 10, wherein the permanent solder mask is laminated to the top surface of the organic substrate and includes a material selected from a group consisting of epoxy, acrylate, and combinations thereof.

16. The chip module heat transfer apparatus as recited in claim 10, further comprising a sealant provided on an end face of the organic substrate, wherein the sealant caps one or more of the thermal dissipation channels.

17. The chip module heat transfer apparatus as recited in claim 16, wherein the sealant includes a material selected from a group consisting of epoxy, silicone, and combinations thereof.

18. The chip module heat transfer apparatus as recited in claim 10, wherein the first one of the one or more thermal dissipation channels substantially surrounds each of the C4 attach pads in the row.

* * * * *